(12) United States Patent
Walter et al.

(10) Patent No.: US 11,949,227 B2
(45) Date of Patent: Apr. 2, 2024

(54) TRANSMITTER FOR TRANSMITTING A PROCESS VARIABLE TO A PROGRAMMABLE LOGIC CONTROLLER

(71) Applicant: IFM Electronic gmbH, Essen (DE)

(72) Inventors: Heinz Walter, Hergatz (DE); Dorin Antonovici, Sibiu (RO)

(73) Assignee: IFM Electronic GmbH, Essen (DE)

( * ) Notice: Subject to any disclaimer, the term of this patent is extended or adjusted under 35 U.S.C. 154(b) by 314 days.

(21) Appl. No.: 17/482,366

(22) Filed: Sep. 22, 2021

(65) Prior Publication Data

US 2022/0094156 A1 Mar. 24, 2022

(51) Int. Cl.
*H02H 7/20* (2006.01)
*G01R 25/00* (2006.01)
*G05B 19/05* (2006.01)

(52) U.S. Cl.
CPC ............ *H02H 7/205* (2013.01); *G01R 25/00* (2013.01); *G05B 19/058* (2013.01); *H02H 7/20* (2013.01)

(58) Field of Classification Search
CPC .......... H02H 7/20; H02H 7/205; G01R 25/00; G05B 19/05; G05B 19/058; G05B 19/054; G05B 2219/1103

USPC ........................................................ 327/108
See application file for complete search history.

(56) References Cited

U.S. PATENT DOCUMENTS

2005/0280448 A1* 12/2005 Walter ...................... G05F 1/46
  327/108
2014/0117970 A1* 5/2014 Kitagaki ................... H02J 1/10
  323/318

* cited by examiner

*Primary Examiner* — Danny Nguyen
(74) *Attorney, Agent, or Firm* — Patent Technologies, LLC; Robert D. Gunderman, Jr.

(57) ABSTRACT

The invention relates to a transmitter for transmitting a process variable to a programmable logic controller. In a current mode a 4-20 milliamp current is fed into a burden and in a voltage mode 0-10 Volt signals are generated. The transmitter includes a process value input, a current stage, a voltage stage and a U/I output for the current or the voltage signal, and a U/I control input for switching between the two modes. The transmitter is configured to feed a current which is dependent on the voltage across the burden into the current stage via a resistor and thus to compensate for a current loss at the voltage stage which is dependent on the voltage across the burden.

8 Claims, 1 Drawing Sheet

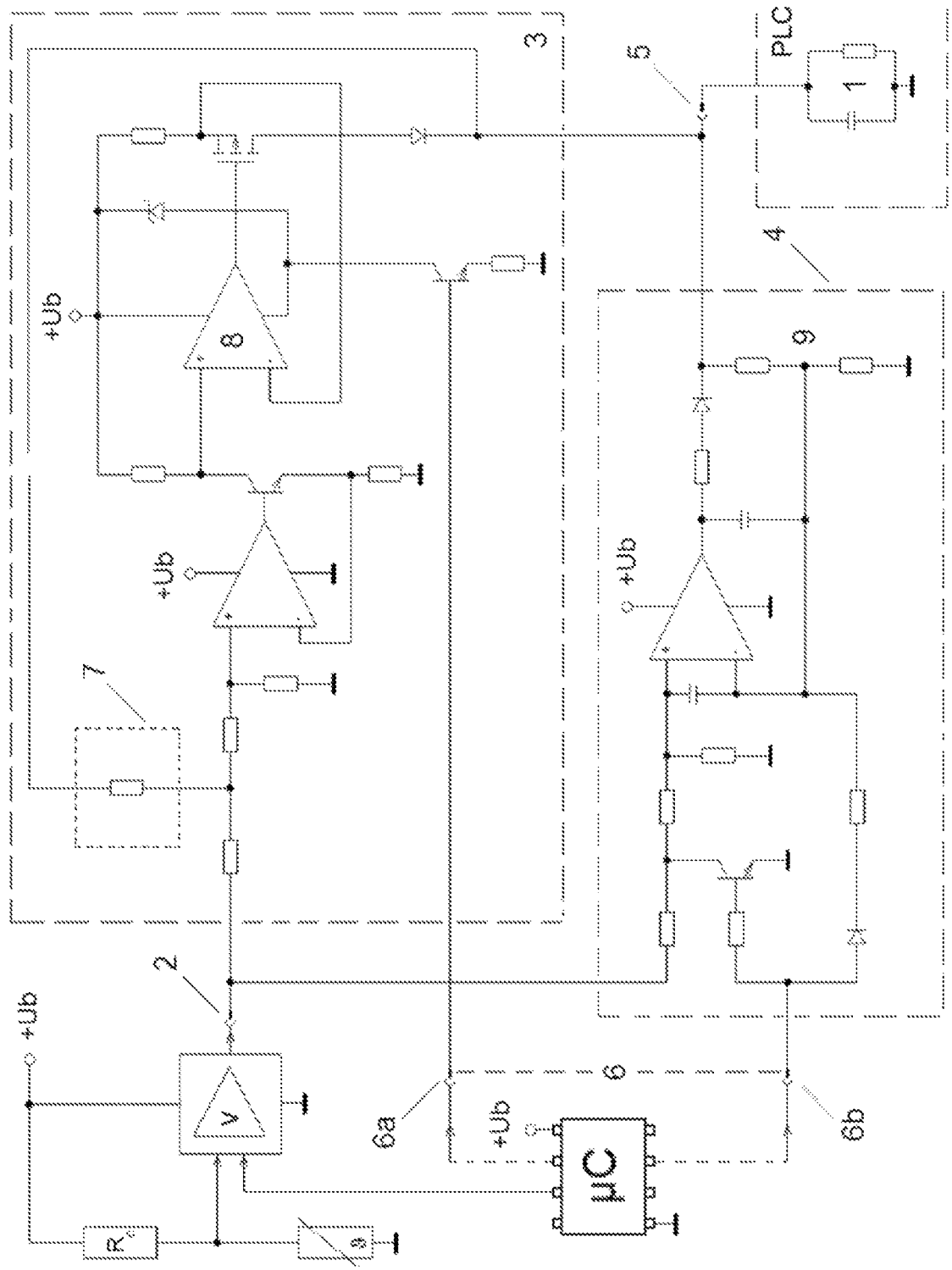

TRANSMITTER FOR TRANSMITTING A PROCESS VARIABLE TO A PROGRAMMABLE LOGIC CONTROLLER

CROSS REFERENCE TO RELATED PATENT APPLICATIONS

This application claims priority to German Patent Application DE2020124816.4 filed on Sep. 23, 2020 entitled "Messumformer zur Übertragung einer Prozessgröße an eine speicherprogrammierbare Steuerung" (Transmitter For Transmitting a Process Variable to a Programmable Logic Controller) by Heinz Walter and Dorin Antonovici, the entire disclosure of which is incorporated herein by reference in its entirety.

BACKGROUND OF THE INVENTION

1. Field of the Invention

This invention relates generally to a transmitter, and more specifically to a transmitter (measuring transducer) for generating an analog current or voltage signal for transmitting a process variable to a programmable logic controller (PLC).

2. Description of Related Art

The standardized electrical signals of process automation at issue here are referred to as unit signals, for which there exist a number of unit controllers and transmitters (measuring transducers) from various manufacturers.

These transmitters are designed as 3-wire transmitters with a voltage output and/or as 2-wire transmitters with a current loop output. They detect process variables such as temperature, pressure, flow rate or filling level (level) and convert them into a unit signal which is further processed by a process control system, usually a programmable logic controller (PIC), and displayed, if necessary.

These unit signals are current signals according to DIN IEC 60381-1 from 0 mA to 20 mA or from 4 mA to 20 mA (with offset zero) or five different voltage signals according to DIN IEC 60381-2, which are all in the range between −10 V and +10 V.

The invention presented here describes an electronic circuit for a transmitter that optionally converts analog measured values into industry-standard voltage or current signals of, for example, 0-10 volts or 4-20 mA.

DE 10 2004 030 161 A1 describes a transmitter for generating the analog current or voltage signals in question, in which a current source and a voltage source are driven in parallel and connected in series at the output side. The current stage is designed here as a differential amplifier stage superimposed on the variable burden. This allows separate balancing processes of the current and voltage source, but the current output value can become burden-dependent due to the resistance tolerances in the current output amplifier.

DE 10 2005 009 459 A1 describes a transmitter in which a distinction is automatically made between a voltage output and a current output.

The proposed arrangement distinguishes between a burden (e.g. <500 ohms) and a load (e.g. >500 ohms), wherein current losses associated with this measurement are avoided by an operational amplifier (OPAMP). In addition, for the calibration processes to be performed separately, another circuit is required which detects the output mode and reports it to the µC.

However, a common terminal for the current and the voltage output inevitably leads to current losses and thus to measurement inaccuracies in the current mode. Remedy could be provided by a voltage stage implemented in a high impedance manner, but this slows down the (passive) discharge of capacitive parts of the burden and therefore leads to long signal decay times without avoiding the current losses completely.

Thus, the only option is to design the voltage stage with a lower impedance, and to compensate the current loss in a suitable way.

The supply of a compensation current is known for current stages from the documents DE102015109095 A1 and EP2219013 B1.

However, the circuits proposed there are on the one hand very complex, that is to say, a current measuring resistor and a control device are required, and on the other hand they cannot be easily integrated into the combined transmitters (U/I transmitters) in question.

Thus, it is the object of the present invention to overcome the above-mentioned disadvantages, to dispense with a (current) measurement, and to provide a simple, inexpensive circuit that can be easily integrated into an existing combined transmitter (U/I transmitter).

The object of the invention is achieved according to claim 1. Advantageous embodiments of the invention are provided in the subclaims.

BRIEF SUMMARY OF THE INVENTION

A Transmitter for transmitting a process variable to a programmable logic controller, wherein in a current mode a 4-20 mA current is fed into a burden and in a voltage mode 0-10 V signals are generated, comprising a process value input, a current stage, a voltage stage and a U/I output for the current or the voltage signal, and a U/I control input for switching between the two modes, wherein the transmitter is configured to feed a current which is dependent on the voltage across the burden into the current stage via a resistor and thus to compensate for a current loss at the voltage stage which is dependent on the voltage across the burden.

BRIEF DESCRIPTION OF THE DRAWINGS

The invention is explained by way of example with reference to the attached drawings based on preferred exemplary embodiments, wherein the features shown below both individually and in combination may represent an aspect of the invention. In the drawings:

FIG. 1 shows schematically the components of the transmitter in accordance with the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification and the attached drawings and claims.

DESCRIPTION OF THE PREFERRED EMBODIMENTS

For a general understanding of the present invention, reference is made to the drawings. The present invention will be described by way of example, and not limitation. Modifications, improvements and additions to the invention described herein may be determined after reading this specification and viewing the accompanying drawings; such modifications, improvements, and additions being considered included in the spirit and broad scope of the present invention and its various embodiments described or envisioned herein.

The present invention relates to a Transmitter For Transmitting a Process Variable to a Programmable Logic Controller.

The essential idea of the invention is to make the output resistance of the voltage stage, which is mainly determined by a voltage divider, as low-ohmic as required for signal technology, and to compensate the current loss by a resistor supplied with the (unknown) burden voltage. This is advantageously achieved by feeding the current determined by said resistor and the voltage across the burden into the current stage, since this makes it proportional to the current losses, which are also dependent on the burden voltage, thus making the above-mentioned complex measuring and control devices dispensable.

As has been found, it is particularly advantageous to dispose the compensation resistor between the U/A output and the input of the current stage.

An advantageous further development of the invention is to prevent a mutual interference between the two operating modes, namely the current mode and the voltage mode, by switching off the current stage by interrupting its supply voltage in the voltage mode, and by short-circuiting the input of the voltage stage in the current mode.

Furthermore, it is advantageous to connect the control input necessary for said switching action to an output of a microcontroller (μC), wherein it is irrelevant whether there is a common control pin for the current stage and the voltage stage, and/or whether they are controlled by different terminals of the μC.

The invention will now be explained in more detail by means of an exemplary embodiment with reference to the drawing.

FIG. 1 shows schematically the components of the transmitter according to the present invention.

Shown is a temperature measuring device with a constant series resistance Rc and a temperature-dependent resistor ϑ in an extremely simplified representation.

The burden 1 consists of an ohmic resistor and a parallel capacitance. It is normally part of a programmable logic controller (PLC).

The process value input 2 receives an analog measurement signal (measured value) generated by an amplifier V, wherein the amplifier V can be controlled by a microcontroller.

Furthermore, a current stage 3 and a voltage stage 4 are shown, which convert the analog measurement value applied to the process value input 2 into a current signal (4-20 mA) or into a voltage signal (0-10 V).

Their outputs are combined as a common U/I output 5 for current or voltage. The mutual interference of these two operating modes is avoided on the one hand by switching off the current stage 3 by interrupting (cutting off) its supply in the voltage mode, and on the other hand by short-circuiting the input of the voltage stage 4 in the current mode. This is done by means of a U/I control input 6 shown here in two parts (two inputs 6a and 6b), wherein via 6a the supply voltage of the operational amplifier 8 controlling the output transistor is interrupted (cut off), and via 6b the input of the voltage stage 4 is short-circuited.

As is easily obvious to a person skilled in the art, 6a and 6b can be combined to form a U/I control input 6, but this deprives the possibility of a separate control of the two output stages 3 and 4.

According to the invention, the output resistance of the voltage stage 4 determined by the voltage divider 9 is designed as low-ohmic as required for signal technology, and the resulting current loss is compensated by a resistor 7 supplied with the (unknown) burden voltage. This is achieved by feeding the current determined by the resistor 7 and the voltage across the burden 1 into the current stage 3, since this current is thereby proportional to the current losses, which are also dependent on the burden voltage, which makes the above-mentioned complex measuring and control devices dispensable.

As has been found, it is particularly advantageous to dispose the compensation resistor 7 between the U/I output 5 and the input of the current stage 3.

The described transmitter can advantageously be used for detecting a process variable in a production plant of the food industry or also of the chemical industry for detecting pressure, temperature, flow rate or filling level (level).

LIST OF REFERENCE SYMBOLS 1 burden
2 process value input
3 current stage
4 voltage stage
5 U/I output
6, 6a, 6b U/i control input
7 compensation resistor
8 operational amplifier
9 voltage divider While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification and the attached drawings and claims.

What is claimed is:

1. A Transmitter for transmitting a process variable to a programmable logic controller, wherein in a current mode a 4-20 mA current is fed into a burden (1) and in a voltage mode 0-10 V signals are generated, comprising a process value input (2), a current stage (3), a voltage stage (4) and a U/I output (5) for the current or the voltage signal, and a U/I control input (6, 6a, 6b) for switching between the two modes, wherein
  the transmitter is configured to feed a current which is dependent on the voltage across the burden (1) into the current stage (3) via a resistor (7) and thus to compensate for a current loss at the voltage stage (4) which is dependent on the voltage across the burden (1).

2. The transmitter according to claim 1, wherein the resistor (7) is disposed between the U/I output (5) and the input of the current stage (3).

3. The transmitter according to claim 1, wherein the transmitter is configured to avoid a mutual interference of the operating modes by switching off the current stage (3) by means of interrupting its supply voltage in the voltage mode, and by short-circuiting the input of the voltage stage (4) in the current mode.

4. The transmitter according to claim 2, wherein the transmitter is configured to avoid a mutual interference of the operating modes by switching off the current stage (3) by means of interrupting its supply voltage in the voltage mode, and by short-circuiting the input of the voltage stage (4) in the current mode.

5. The transmitter according to claim 1, wherein the U/I control input (6, 6*b*) is connected to an output of a microcontroller.

6. The transmitter according to claim 2, wherein the U/I control input (6, 6*b*) is connected to an output of a microcontroller.

7. The transmitter according to claim 3, wherein the U/I control input (6, 6*b*) is connected to an output of a microcontroller.

8. The transmitter according to claim 4, wherein the U/I control input (6, 6*b*) is connected to an output of a microcontroller.

\* \* \* \* \*